United States Patent [19]

Beasley et al.

[11] Patent Number: 4,698,521

[45] Date of Patent: Oct. 6, 1987

[54] BI-DIRECTIONAL CURRENT SWITCH

[75] Inventors: James E. Beasley, Chatsworth; Steven M. Lindsey, Redondo Beach, both of Calif.

[73] Assignee: Hughes Aircraft Company, Los Angeles, Calif.

[21] Appl. No.: 832,210

[22] Filed: Feb. 24, 1986

[51] Int. Cl.$^4$ .................. H03K 3/01; H03K 17/60
[52] U.S. Cl. .................. 307/270; 307/249; 307/250; 307/255
[58] Field of Search .......... 307/270, 249, 255, 296 R, 307/297, 250; 323/312, 317

[56] References Cited

U.S. PATENT DOCUMENTS

| | | | |
|---|---|---|---|
| 3,649,769 | 3/1972 | Pest | 307/255 |
| 3,798,471 | 3/1974 | Williams et al. | 307/270 |
| 4,536,662 | 8/1985 | Fujii | 307/297 |

OTHER PUBLICATIONS

Analysis and Design of Analog Integrated Circuits, by P. Gray and R. Meyer (1977), pp. 239-242.

Primary Examiner—Stanley D. Miller
Assistant Examiner—Trong Quang Phan
Attorney, Agent, or Firm—S. M. Mitchell; M. J. Meltzer; A. W. Karambelas

[57] ABSTRACT

A bi-directional current switch is provided which serves as a DC coupler mixer driver for PSK modulators. The invention includes a first switchable current source for selectively providing one of at least two current flow rates at an output node. A second current source acts as a sink and provides a steady state current flow rate out of said node. When the first current source is switched on, the output current is reversed. The invention thereby provides bi-directional current switching in response to a logical input signal.

10 Claims, 2 Drawing Figures

BI-DIRECTIONAL CURRENT SWITCH

BACKGROUND OF THE INVENTION

1. Field of the Invention

The present invention relates to communications systems. More specifically, the present invention relates circuits for optimizing the performance of phase shift keyed modulation schemes.

While the present invention is described herein with reference to a particular embodiment for particular applications, it is understood that the invention is not limited thereto. Those having ordinary skill in the art and access to the teachings of the present invention will recognize additional modifications and applications within the scope thereof.

2. Description of the Related Art

The advantages of phase shift keyed (PSK) modulation are well recognized. PSK modulation schemes are used to allow for efficient power distribution in spread spectrum communications links. PSK is used to encode digital information in time division multiple access systems. PSK pulse coding in radar systems has been found to enhance the performance and range of the system. PSK has recently been employed in navigation systems.

In PSK modulation, an RF signal is modulated by a data code. The data code is typically a train of pulses which vary between +1 and −1. The data code effectively shifts the phase of the RF signal between nominal positive and negative levels. Demodulation therefore requires the removal of the coded or keyed phase shift.

Where the modulation code is periodic or pseudorandom, demodulation at the receiver is relatively straightforward. All that is required is the mixing of a synchronized duplicate of the modulation code with the received modulated signal. However, where the code is random ie. data, another demodulation scheme must be used.

Such schemes typically provide for capacitive AC coupling of a signal into a balanced mixer. In digital applications, AC coupling works well with suitably high data rates. As the data rates become low, however, the quality of the signal provided by the coupling capacitor to the mixer may become unsatisfactory. The corresponding undesirable effect on the mixer output may result in errors in the received data.

In addition, it is known that when the output of the mixer is maintained at a constant level, problems associated with reception are minimized. The design of the receiver should be optimized and matched with the design of the transmitter. To achieve these these advantages, DC coupling has been considered as an alternative.

DC coupling (or level shifting) is often accomplished with linear amplifiers. While eliminating the problem with low data rates suffered by AC coupled schemes, DC coupling is problematic in that: (1) linear amplifiers often provide an output that is sensitive to power supply variations and (2) low power linear amplifiers are typically not fast enough and high speed devices typically consume too much power for space applications.

In *Analysis and Design of Analog Integrated Circuits*, (1977) by P. Gray and R. Meyer, p. 241; a circuit as shown which is relatively insensitive to power supply variations. The circuit is a current source. No means are shown for switching the current source to provide a high speed bipolar output.

Thus there is considered to be a need in the art for a high speed DC coupled mixer driver for a PSK modulator that is insensitive to power supply variations with minimal power consumption.

SUMMARY OF THE INVENTION

The present invention provides a bi-directional current switch which serves as a DC coupled mixer driver for PSK modulators. The invention substantially overcomes many of the problems associated with prior art drivers.

The invention includes a first switchable current source for selectively providing one of at least two current flow rates at an output node. A second current source acts as a sink and provides a current sink out of said node.

A particular embodiment is illustrated wherein the second current source acts as a sink and causes current to flow in a first direction when said first current source is off. When the first current source is switched on, the net current flow is reversed.

DESCRIPTION OF THE INVENTION

Figure 1:
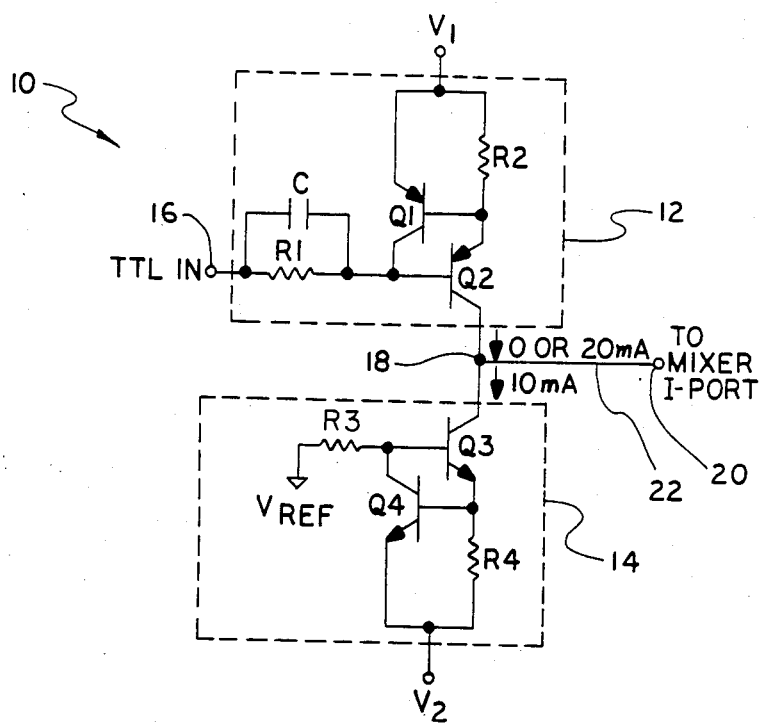
FIG. 1 is a schematic diagram of the preferred embodiment of the present invention.
Figure 2:
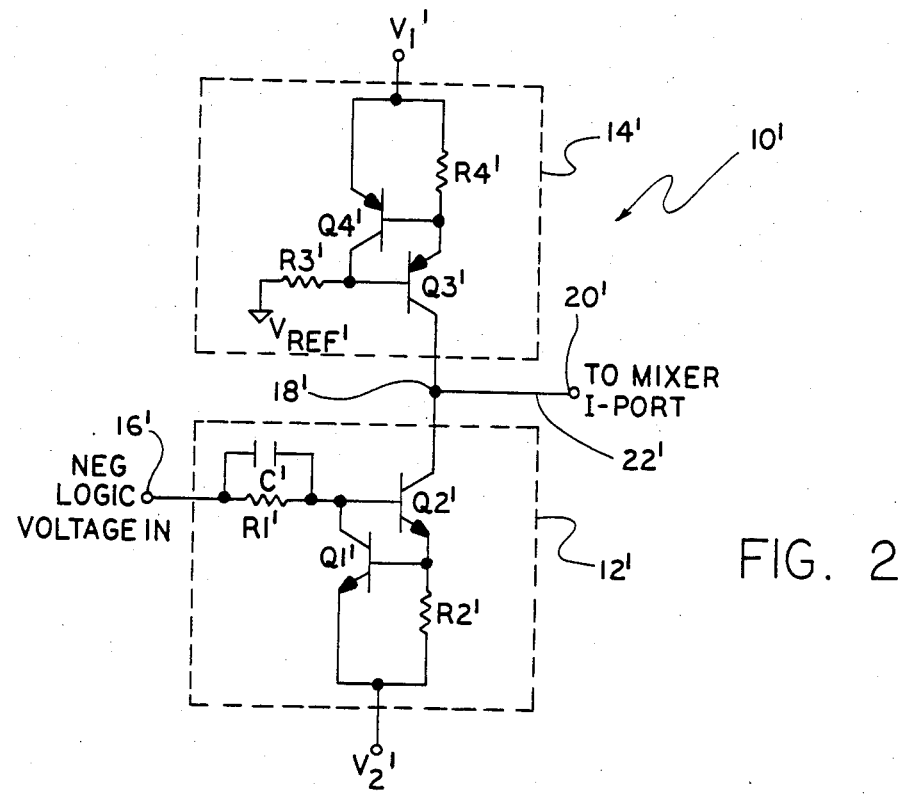
FIG. 2 is a schematic diagram of an alternative embodiment of the present invention.

The mixer driver of the present invention is illustrated in the schematic diagrams of FIGS. 1 and 2. The embodiment of FIG. 1 is intended for operation in a TTL (transistor-transistor logic) environment where the input is expected to be a positive logic signal. The embodiment of FIG. 2 is intended for an ECL (emitter coupled logic) environment where the input is expected to be a negative logic signal.

As shown in the illustrative embodiment of FIG. 1, the invention 10 includes a first switchable current source 12 and a second steady state current source 14. The two current sources cooperate in the manner discussed below to provide a bi-directional current switch.

The first current source includes two PNP transistors Q1 and Q2. The first transistor Q1 is connected between the supply V1 and the base of the second transistor Q2. That is, its emitter is connected to the supply V1 and its collector is connected to the base of the second transistor Q2. The base of transistor Q1 is connected to the emitter of the second transistor Q2.

A resistor R1 couples a TTL input signal from the input terminal 16 into the base of the second transistor Q2. The capacitor C is connected across the resistor R1 and serves to speed up the activation of transistor Q2. A second resistor R2 is provided between the supply V1 and the emitter of the second transistor Q2. The collector of the second transistor Q2 is tied to the output node 18. The output node 18 is tied to the output terminal 20 via an output path 22. The collector of transistor Q3 of the second current source 14 is also connected to the output node 18. Thus connected, the transistors Q1 and Q2 provide a modified simple current source. The resistor R2 provides a different base-emitter voltage for Q1 than for Q2. This allows for the development of an adequate reference current into Q2 without the need for a large biasing resistor. The components should be chosen so that transistors Q1 and Q2 are biased in the active mode when turned on. The speed of the invention is further enhanced by use of transistors having a high cut-off frequency of a high gain-bandwidth product.

With the exception of the speed-up capacitor C, the second current source 14 is a mirror image of the first current source 12. It includes third and fourth transistors Q3 and Q4 which are NPN transistors. The base of the third transistor Q3 is fed by a reference voltage from a supply Vref via a resistor R3. The fourth transistor Q4 is connected between the base of the third transistor Q3 and the supply V2. That is, the collector of the transistor Q4 is connected to the base of the transistor Q3 and the emitter of the transistor Q4 is connected to the supply V2. The base of the transistor Q4 is connected to the emitter of the transistor Q3. A resistor R4 is provided between the emitter of the transistor Q3 and the supply V2. The resistor R4 serves the same purpose as the resistor R2 of the first current source 12.

As discussed by Paul R. Gray and Robert G. Meyer in *Analysis and Design of Analog Integrated Circuits,* supra, the arrangement of transistors Q1 and Q2 and resistor R2 forms a basic supply independent current source. Similarly, the arrangement of transistors Q3 and Q4 and resistor R4 forms a second basic supply independent current source.

The collector current of Q2 (I2) is equal to the voltage drop across R2 (VR2) divided by the resistance of R2. Since the drop across R2 is equal to the base-emitter voltage of Q1 (VBE1), $$I2 = VBE1/R2.$$

According to Gray and Meyer, the base-emitter voltage of Q1 is given by the relationship:

$$VBE1 = (kT/q) \times \ln(Iref/Isl).$$

where Iref is the collector current in transistor Q1 and is given by:

$$Iref = (V1 - VBE1 - VBE2)/R1$$

and

Isl = the base-emitter junction reverse saturation current of Q1.
VBE2 = base-emitter voltage of Q2,
k = Boltzman's constant
T = junction temperature relative to absolute zero and
q = charge on an electron.

Since the base-emitter voltages of Q1 and Q2 thermally track each other the difference therebetween is relatively constant. Thus, the output current I2 is only logarithmically sensitive to the supply voltage V1. As a result, the arrangements of transistors Q1 and Q2 and Q3 and Q4 provide current regulators. Additionally, as discussed more fully below, the arrangement of the first current source provides a current switch in that the output thereof tracks the TTL digital input signal.

The components should be chosen so that the current flow in the collector of Q2 is twice that in the collector of Q3. Table 1 below provides typical values which should illustrate the principle teachings of the present invention.

TABLE 1

| Component | Specification |
|---|---|
| Q1, Q2 | NE88935 |
| Q3, Q4 | NE73435 |
| R1, R3 | 8.2K ohm |

TABLE 1-continued

| Component | Specification |
|---|---|
| R2 | 36 ohm |
| R4 | 68 ohm |
| C | 1 pf NPO |
| V1 | 5 volts |
| V2 | −5 volts |
| Vref | 0 volts |

In operation, assuming a high input signal is present at the input terminal 16, transistor Q2, the current switch, is off. Therefore, the first current source 12 is off. Transistor Q3 of the second current source 14 is biased in the "on" state by Vref and V2. Transistor Q3 provides a steady state current flow out of the node 18 so long as the first current source is off. That is, the second current source 14 provides a steady state current drain so long as the input signal is high.

When the input signal at terminal 16 goes low, the capacitor C causes a negative pulse to appear at the base of the transistor Q2 rapidly dissipating the stored charge at the base-emitter junction of transistor Q2 while forward biasing the junction thereby turning Q2 on. As current begins to flow in the emitter of Q2, the base-collector junction of transistor Q1 is forward biased and transistor Q1 is turned on. Thus, the first current source 12 is turned on.

Assuming components of Table 1 are used, I2=20 ma and I3, the collector current in transistor Q3, is 10 ma. Since both current sources 12 and 14 are regulated, the second current source 14 can only sink 10 ma of current. As a result, the remaining current must flow in path 22 toward the output terminal 20 as a positive output to the load. The net effect, is a reversal of the 10 ma current flow in response to a change in the input to the first current source 12. The output current is bi-polar and constant in magnitude. That is, bi-directional current switching is accomplished in response to a logical input signal.

FIG. 2 shows an alternative ECL embodiment intended for an environment where the input is expected to be a negative logic signal. The ECL embodiment 10' includes a first switchable current source 12' and a second steady state current source 14'. The two current sources cooperate in the manner discussed below to provide a bi-directional current switch.

The first current source includes two NPN transistors Q1' and Q2'. The first transistor Q1' is connected between the supply V2' and the base of the second transistor Q2'. That is, its emitter is connected to the supply V2' and its collector is connected to the base of the second transistor Q2'. The base of transistor Q1' is connected to the emitter of the second transistor Q2'.

A resistor R1' couples an ECL input signal from the terminal 16' into the base of the second transistor Q2'. The capacitor C' is connected across the resistor R1' and serves to speed up the activation of transistor Q2'. A second resistor R2' is provided between the supply V2' and the emitter of the second transistor Q2'. The collector of the second transistor Q2' is tied to the output node 18'. The output node 18' is tied to the output terminal 20' via an output path 22'. The collector of transistor Q3' of the second current source 14' is also connected to the output node 18'. Thus connected, the transistors Q1' and Q2' provide a modified simple current source. The resistor R2' provides a different base-emitter voltage for Q1' than for Q2'. This allows for the development of an adequate reference current into Q2' without the need for a large biasing resistor. The components should be chosen so that transistors Q1' and Q2' are biased in the active region when turned on.

With the exception of the speed-up capacitor C', the second current source 14' is a mirror image of the first current source 12'. It includes third and fourth transistors Q3' and Q4' which are PNP transistors. The base of the third transistor Q3' is fed by a reference voltage from a supply Vref via a resistor R3'. The fourth transistor Q4' is connected between the base of the third transistor Q3' and the supply V1'. That is, the collector of the transistor Q4' is connected to the base of the transistor Q3' and the emitter of the transistor Q4' is connected to the supply V1'. The base of the transistor Q4' is connected to the emitter of the transistor Q3'. A resistor R4' is provided between the emitter of the transistor Q3' and the supply V1'. The resistor R4' serves the same purpose as the resistor R2' of the first current source 12'.

In operation, assuming a high negative logic input signal is present at the input terminal 16', transistor Q2', the current switch, is off. Therefore, the first current source 12' is off. The transistor Q3' of the second current source 14' is biased in the "on" state by Vref and V1'. Transistor Q3' provides a steady state current flow into the node 18' so long as the first current source 12' is off. Current flows in a positive direction from the output node 18' to the output terminal 20' via path 22'.

When the input signal at terminal 16' goes low, the capacitor C' causes a positive pulse to appear at the base of the transistor Q2' rapidly dissipating the stored charge at the base-emitter junction of transistor Q2' while forward biasing the junction thereby turning Q2' on. As current begins to flow in the emitter of Q2', the base-collector junction of transistor Q1' is forward biased and transistor Q1' is turned on. Thus, the first current source 12' is turned on. When the first current source 12' is turned on, it provides a current sink at twice the flow rate of the second current source 14' assuming components of appropriate specification are chosen as taught above. Thus, an output current of the same magnitude now flows in the reverse negative direction from terminal 20' to node 18' via path 22'. Thus bi-directional current switching is accomplished in response to a logical input signal.

The present invention has been described herein with reference to particular embodiments in particular applications. Those of ordinary skill in the art and access to the teachings of the present invention will recognize additional modifications and applications within the scope thereof. It is intended by the appended Claims to cover any and all such modifications.

Accordingly, what is claimed is:

1. A bi-directional current switch having an input terminal, an output terminal and first and second power supply terminals for driving a load coupled to said output terminal in response to an input signal applied to said input terminal, said current switch comprising:
   a first transistor having a first electrode connected to a first power supply, a second electrode connected to a first electrode of a second transistor and a third electrode connected to the second electrode of said second transistor, said second transistor having a third electrode connected to a node, said node connected to said output terminal by an output path;
   first input means for coupling a first input terminal to the second electrode of said second transistor;
   first output means connected between said first power supply and the first electrode of said second transistor for setting a first level of current flow between the third electrode of said second transistor and said output node;
   a third transistor having a third electrode connected to said node, a second electrode connected the third electrode of a fourth transistor, and a first electrode connected to a second electrode of said fourth transistor, said fourth transistor having a first electrode connected to a second power supply;
   second input means for coupling a second input signal to the second electrode of said third transistor; and
   second output means connected between said second power supply and the first electrode of said third transistor for setting the level of current flow between the third electrode of said third transistor and said node.

2. The bi-directional current switch of claim 1 wherein said first and second transistors are bipolar PNP transistors.

3. The bi-directional current switch of claim 2 wherein said third and fourth transistors are bipolar NPN transistors.

4. The bi-directional current switch of claim 3 wherein said first, second, and third terminals of said first, second, third, and fourth transistors are collector, base and emitter terminals respectively.

5. The bi-directional current switch of claim 1 wherein said first input means is a first resistor.

6. The bi-directional current switch of claim 5 including a first capacitor connected across said first resistor.

7. The bi-directional current switch of claim 1 wherein said second input means is a second resistor.

8. The bi-directional current switch of claim 7 including a second capacitor connected across said second resistor.

9. The bi-directional current switch of claim 1 wherein said first output means is a first output resistor.

10. The bi-directional current switch of claim 1 wherein said second output means is a second output resistor.

* * * * *